(12) United States Patent
Song et al.

(10) Patent No.: US 10,840,884 B2
(45) Date of Patent: Nov. 17, 2020

(54) BULK ACOUSTIC WAVE (BAW) AND PASSIVE-ON-GLASS (POG) FILTER CO-INTEGRATION

(71) Applicant: QUALCOMM Incorporated, San Diego, CA (US)

(72) Inventors: Stanley Seungchul Song, San Diego, CA (US); Jonghae Kim, San Diego, CA (US); Periannan Chidambaram, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 181 days.

(21) Appl. No.: 15/988,993

(22) Filed: May 24, 2018

(65) Prior Publication Data

US 2019/0363694 A1   Nov. 28, 2019

(51) Int. Cl.
| | |
|---|---|
| *H05K 1/02* | (2006.01) |
| *H03H 9/54* | (2006.01) |
| *H01Q 1/50* | (2006.01) |
| *H03H 3/02* | (2006.01) |
| *H03H 9/02* | (2006.01) |
| *H03H 9/17* | (2006.01) |
| *H03H 9/56* | (2006.01) |
| *H04B 1/40* | (2015.01) |

(52) U.S. Cl.
CPC .............. *H03H 9/542* (2013.01); *H01Q 1/50* (2013.01); *H03H 3/02* (2013.01); *H03H 9/02015* (2013.01); *H03H 9/175* (2013.01); *H03H 9/562* (2013.01); *H03H 2003/025* (2013.01); *H04B 1/40* (2013.01)

(58) Field of Classification Search
CPC ...... H03H 9/542; H03H 3/02; H03H 9/02015; H03H 9/175; H03H 9/562; H03H 2003/025; H03H 9/0542; H01Q 1/50; H04B 1/40
See application file for complete search history.

(56) References Cited

U.S. PATENT DOCUMENTS

| | | | | |
|---|---|---|---|---|
| 5,872,493 A | * | 2/1999 | Ella | H03H 3/02 310/322 |
| 2001/0048352 A1 | | 12/2001 | Klee et al. | |
| 2002/0021192 A1 | * | 2/2002 | Klee | H03H 3/02 333/187 |

(Continued)

FOREIGN PATENT DOCUMENTS

CN     105811914 A     7/2016

OTHER PUBLICATIONS

International Search Report and Written Opinion—PCT/US2019/029848—ISA/EPO—dated Jul. 29, 2019.

(Continued)

*Primary Examiner* — Dameon E Levi
*Assistant Examiner* — David E Lotter
(74) *Attorney, Agent, or Firm* — Qualcomm Incorporated/Seyfarth Shaw LLP

(57) ABSTRACT

An electronic device includes a passive substrate. A passive-on-glass (POG) device is on the passive substrate. A bulk acoustic wave (BAW) filter is on the passive substrate. The POG device can be any type of passive component/device, such as an inductor, capacitor, LC-resonator or filter. The POG device can include a piezoelectric material. The POG device and the BAW filter may be side-by-side on the passive substrate.

18 Claims, 11 Drawing Sheets

(56) References Cited

U.S. PATENT DOCUMENTS

| | | |
|---|---|---|
| 2013/0154088 A1 | 6/2013 | Cable et al. |
| 2014/0035702 A1* | 2/2014 | Black ............... H03H 7/075 333/186 |
| 2014/0085020 A1 | 3/2014 | Reinhardt et al. |
| 2016/0322235 A1* | 11/2016 | Jiang ............ H01L 21/32136 |
| 2017/0084592 A1 | 3/2017 | Takatani et al. |
| 2017/0186710 A1 | 6/2017 | Yoon et al. |
| 2017/0187345 A1 | 6/2017 | Yun et al. |
| 2017/0365775 A1* | 12/2017 | Adkisson ............ H01L 41/25 |
| 2018/0367119 A1* | 12/2018 | Lee .................. H03H 9/564 |

OTHER PUBLICATIONS

Lakin K., "Thin Film Resonator Technology," IEEE Transactions on Ultrasonics, Ferroelectrics and Frequency Control, vol. 52, No. 5, May 2005, pp. 707-716, XP011367390, sections IV,V.

Lakin K.M., et al., "Development of Miniature Filters for Wireless Applications," Microwave Symposium Digest, IEEE MTT-S International 1995, vol. 2, pp. 883-886.

Loebl H.P., et al., "Solidly Mounted Bulk Acoustic Wave Filters for the GHZ Frequency Range", 2002 IEEE Ultrasonics Symposium Proceedings, vol. 1, 2002, XP008040146, section I, pp. 919-932.

\* cited by examiner

BULK ACOUSTIC WAVE (BAW) AND PASSIVE-ON-GLASS (POG) FILTER CO-INTEGRATION

TECHNICAL FIELD

The present disclosure generally relates to integrated circuits (ICs). More specifically, the present disclosure relates to co-integration of a bulk acoustic wave (BAW) filter and a passive-on-glass (POG) device.

BACKGROUND

The design complexity of mobile radio frequency (RF) chips (e.g., mobile RF transceivers) is complicated by added circuit functions for supporting communication enhancements. Designing mobile RF transceivers may include using acoustic filters and resonators for processing signals carried in a communications system. Many passive devices, such as inductors and capacitors, may be included in such filters and resonators.

Existing passive-on-glass (POG) filters are used for broadband applications for filtering signals. Existing bulk acoustic wave (BAW) filters demonstrate a high quality (Q)-factor. Although existing POG and BAW filters may be implemented together in an integrated circuit (IC), they are not fabricated together on a single substrate. That is because existing POG filters are fabricated on glass, and existing BAW filters are fabricated on silicon (Si). It would be desirable to co-integrate POG and BAW filters for improved performance and reduced fabrication costs.

SUMMARY

An electronic device includes a passive substrate. A passive-on-glass (POG) device is on the passive substrate. A bulk acoustic wave (BAW) filter is on the passive substrate.

A method of fabricating an electronic device having a passive-on-glass (POG) device and a bulk acoustic wave (BAW) filter includes fabricating a mirror on a BAW portion of a substrate. The method includes depositing a first conductive layer on the mirror as a part of the BAW filter and on a POG portion of the substrate as part of the POG device. The method includes depositing a piezoelectric layer on the first conductive layer as part of the BAW filter and the POG device. The method further includes depositing a second conductive layer on the piezoelectric layer as part of the BAW filter and the POG device.

A radio frequency (RF) front end module includes an electronic device having a passive substrate. A passive-on-glass (POG) device is on the passive substrate. A bulk acoustic wave (BAW) filter is on the passive substrate. An antenna is coupled to the electronic device.

This has outlined, rather broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
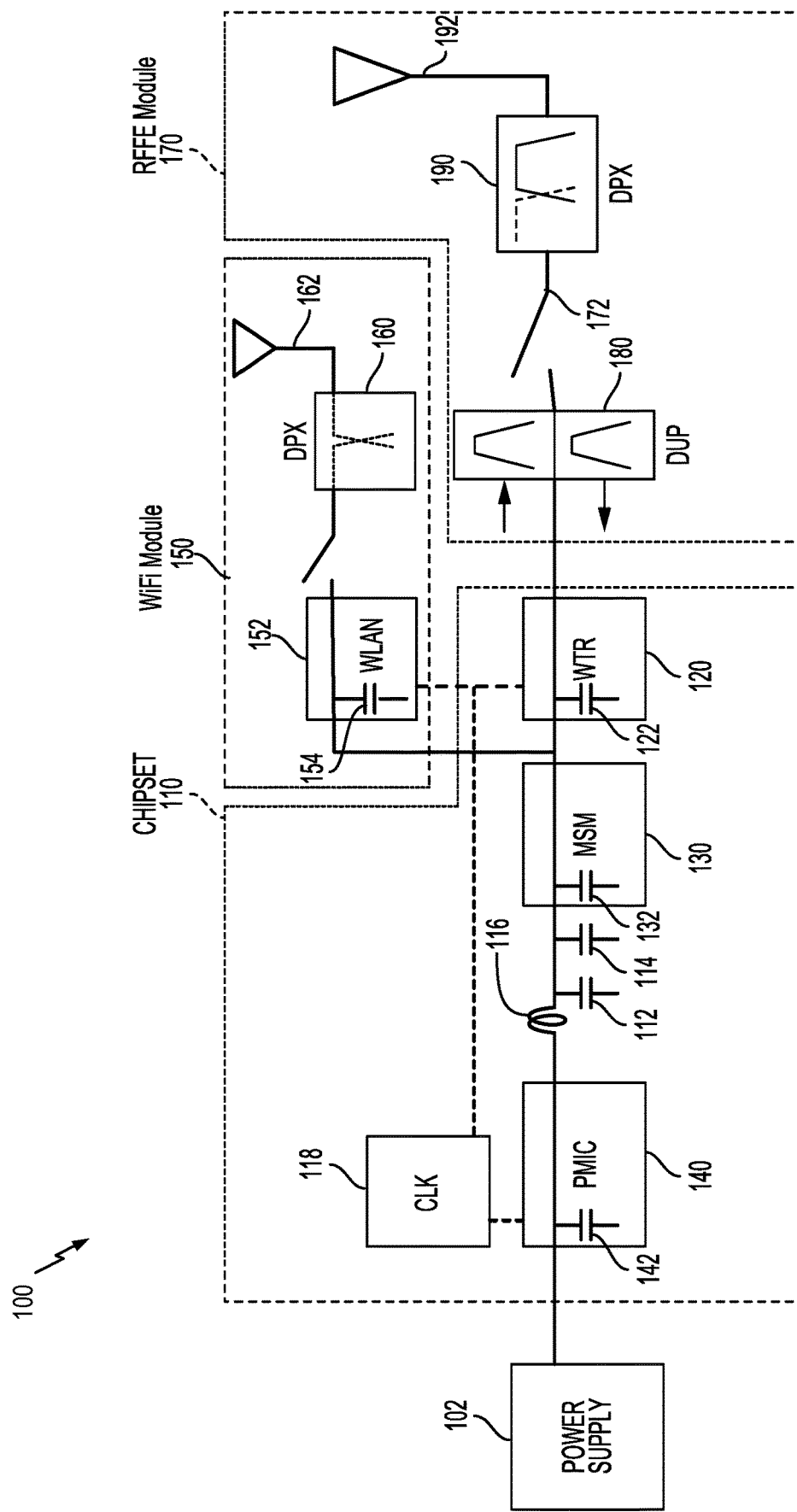
FIG. 1 is a schematic diagram of a wireless device having a wireless local area network module and a radio frequency (RF) front end module for a chipset.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR", and the use of the term "or" is intended to represent an "exclusive OR." As described herein, the term "exemplary" used throughout this description means "serving as an example, instance, or illustration," and should not necessarily be construed as preferred or advantageous over other exemplary configurations. The term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Mobile radio frequency (RF) chips (e.g., mobile RF transceivers) have migrated to a deep sub-micron process node due to cost and power consumption considerations. The design complexity of mobile RF transceivers is further complicated by adding circuit functions for supporting communication enhancements, such as fifth generation (5G) technologies. Further design challenges for mobile RF transceivers include analog/RF performance considerations, including mismatch, noise and other performance considerations. Designing these mobile RF transceivers includes using passive devices, for example, for suppressing resonance, and/or for performing filtering, bypassing, and coupling.

Successfully fabricating modern semiconductor chip products involves interplay between the materials and the processes employed. In particular, passive components for modern semiconductor chips is an increasingly challenging part of the process flow. This is particularly true in terms of maintaining a small feature size. The same challenge of maintaining a small feature size also applies to passive-on-glass (POG) technology. Passive-on-glass technology enables fabrication of high performance components, such as inductors and capacitors, which are built on a highly insulative substrate having a very low loss.

Passive-on-glass devices include high performance inductor and capacitor components having a variety of advantages over other technologies (e.g., surface mount technology or multi-layer ceramic chips). These advantages include being more compact in size and having smaller manufacturing variations. Passive-on-glass devices also support a higher quality (Q)-factor value that meets stringent low insertion loss and low power consumption specifications of future process nodes. Passive devices such as inductors may be implemented as three-dimensional (3D) structures when using passive-on-glass technologies. 3D through substrate inductors or other 3D devices, however, may experience a number of design constraints when implemented as 3D structures using passive-on-glass technology.

Various aspects of the present disclosure provide techniques for fabrication of a co-integrated bulk acoustic wave (BAW) filter and passive-on-glass (POG) device (e.g., an electronic device). The process flow for semiconductor fabrication of the multiplexer structure may include front-end-of-line (FEOL) processes, middle-of-line (MOL) processes, and back-end-of-line (BEOL) processes. It will be understood that the term "layer" includes film and is not to be construed as indicating a vertical or horizontal thickness unless otherwise stated. As described herein, the term "substrate" may refer to a substrate of a diced wafer or may refer to a substrate of a wafer that is not diced. Similarly, the terms "chip" and "die" may be used interchangeably.

As described herein, the back-end-of-line interconnect layers may refer to the conductive interconnect layers (e.g., metallization one (M1), metallization two (M2), metallization three (M3), etc.) for electrically coupling to front-end-of-line active devices of an integrated circuit. The back-end-of-line interconnect layers may electrically couple to middle-of-line interconnect layers, for example, connecting M1 to an oxide diffusion (OD) layer of an integrated circuit. A back-end-of-line first via (V2) may connect M2 to M3 or others of the back-end-of-line interconnect layers.

Existing passive-on-glass (POG) filters are used for broadband applications for filtering signals. Existing bulk acoustic wave (BAW) filters demonstrate a high quality (Q)-factor. Although existing POG and BAW filters may be implemented together in an integrated circuit (IC), they are not fabricated together on a single substrate. Fabrication on a single substrate is not performed because existing POG filters are fabricated on glass, while existing BAW filters are fabricated on silicon (Si). It would be desirable to co-integrate POG and BAW filters for improved performance and reduced fabrication costs.

Aspects of the present disclosure describe a co-integrated POG and BAW filter. Advantages include reduced cost of fabrication and improved broadband characteristics. Additionally, a high resistivity of glass provides lower loss to the BAW filter.

FIG. 1 is a schematic diagram of a wireless device 100 (e.g., a cellular phone or a smartphone) having a wireless local area network module and a radio frequency (RF) front end module for a chipset. The wireless device 100 has a wireless local area network (WLAN) (e.g., WiFi) module 150 and an RF front end (RFFE) module 170 for a chipset 110. The WiFi module 150 includes a first diplexer 160 communicably coupling an antenna 162 to a wireless local area network module (e.g., WLAN module 152). The RF front end module 170 includes the second diplexer 190 communicably coupling an antenna 192 to the wireless transceiver 120 (WTR) through a duplexer 180 (DUP). An RF switch 172 communicably couples the second diplexer 190 to the duplexer 180.

The wireless transceiver 120 and the WLAN module 152 of the WiFi module 150 are coupled to a modem (MSM, e.g., a baseband modem) 130 that is powered by a power supply 102 through a power management integrated circuit (PMIC) 140. The chipset 110 also includes capacitors 112 and 114, as well as an inductor(s) 116 to provide signal integrity. The PMIC 140, the modem 130, the wireless transceiver 120, and the WLAN module 152 each include capacitors (e.g., 142, 132, 122, and 154) and operate according to a clock 118. The geometry and arrangement of the various inductor and capacitor components in the chipset 110 may reduce the electromagnetic coupling between the components. The RFFE module 170 may include a co-integrated bulk acoustic wave (BAW) and passive-on-glass (POG) device.

Conventional POG filters are used for broadband applications for filtering signals, and conventional BAW filters demonstrate a high quality (Q)-factor. Existing POG filters and BAW filters are not fabricated together on a single substrate because existing POG filters are fabricated on glass, and existing BAW filters are fabricated on silicon (Si). It would be desirable to co-integrate a POG filter and a BAW filter for improving performance and reducing fabrication costs.

Aspects of the present disclosure describe a co-integrated POG and BAW filter. Advantages include reduced cost of fabrication and improved broadband characteristics. Additionally, a high resistivity of glass provides lower loss to the BAW filter.

Figure 2:
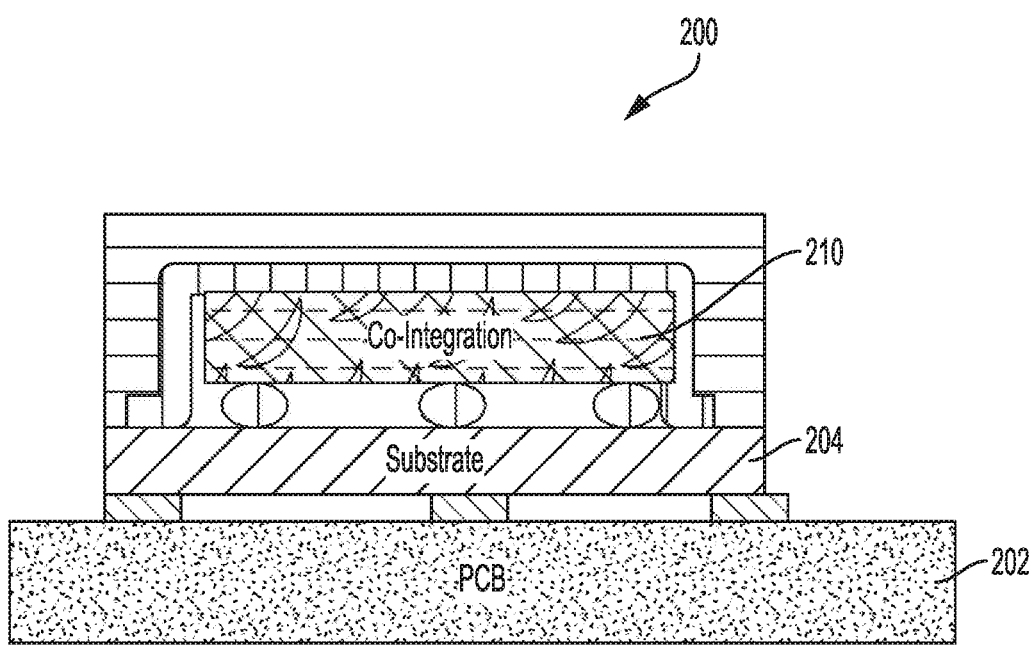
FIG. 2 illustrates an electronic device, according to aspects of the present disclosure.

FIG. 2 illustrates an electronic device 200, according to aspects of the present disclosure. The electronic device 200 may include a co-integrated POG and BAW filter 210 coupled to a substrate 204. The substrate 204 may be coupled to a printed circuit board (PCB) 202. As illustrated, the BAW and POG filters are co-integrated as a single unit, thus saving space and reducing fabrication costs for the electronic device 200. Additionally, the device exhibits improved broadband characteristics and lower loss relative to a conventional BAW filter. Additional details of the co-integrated POG and BAW filter 210 are described below.

Figure 3:
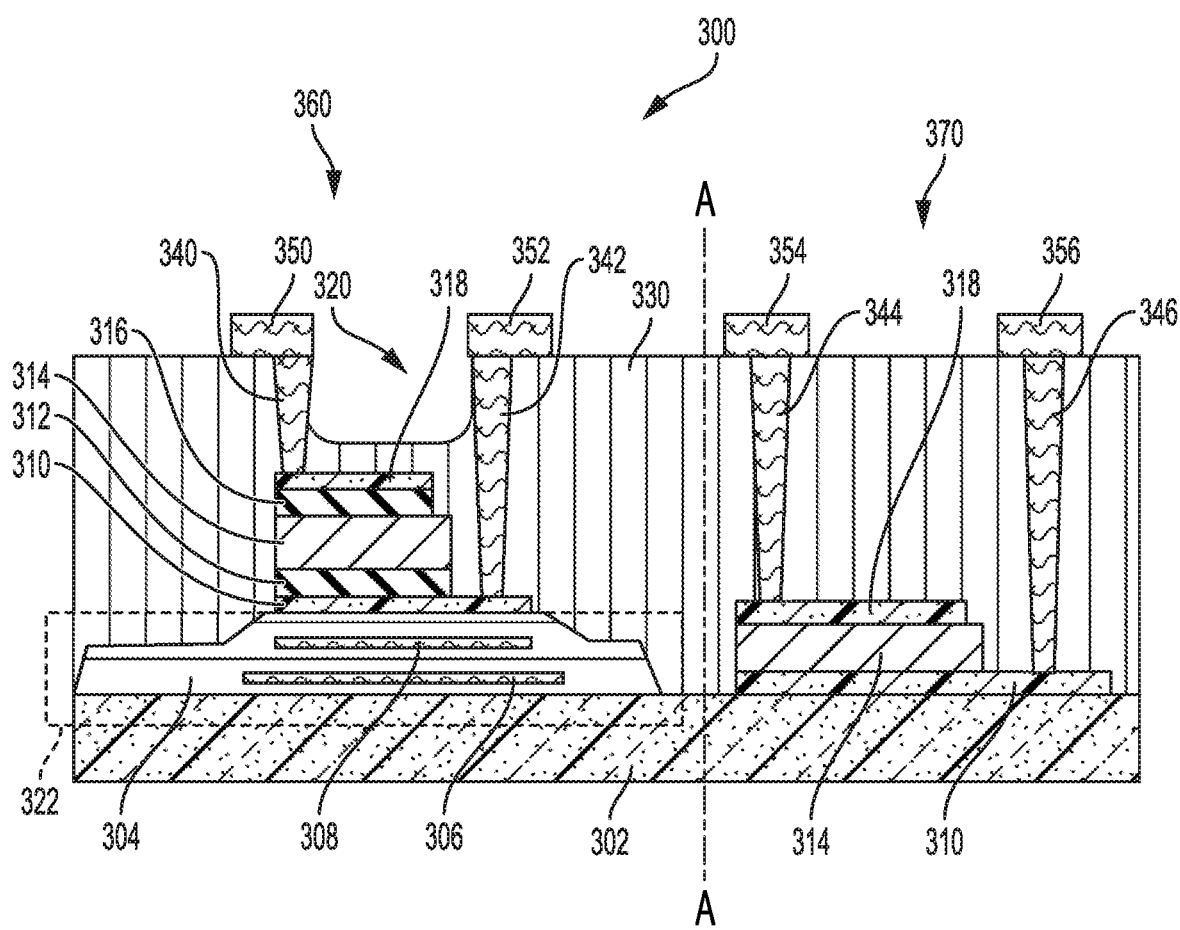
FIG. 3 illustrates a co-integrated bulk acoustic wave (BAW) filter and passive on glass (POG) device, according to aspects of the present disclosure.

FIG. 3 illustrates a co-integrated bulk acoustic wave (BAW) filter and passive-on-glass (POG) device, according to aspects of the present disclosure. In this aspect of the present disclosure, a co-integrated BAW/POG filter 300 may include any passive device, such as, but not limited to, inductors, capacitors, and/or resistors. In this example, the co-integrated BAW/POG filter 300 includes a BAW filter 360 side-by-side with a POG device 370. The POG device 370 may be any passive device such as an inductor, capacitor, inductor-capacitor (LC) resonator, filter, or the like. For example, elements to the left of dotted line A-A may be a BAW portion of a substrate 302, and elements to the right of the dotted line A-A may be a POG portion of the substrate 302.

The BAW filter 360 may include a mirror 322 formed on the substrate 302. For example, the substrate may be a passive substrate, such as a glass substrate. The mirror 322 may include a first mirror layer 306 and a second mirror layer 308 formed in an oxide layer 304. The first mirror layer 306 may be composed of a titanium (Ti)/tungsten (W) layer, and the second mirror layer 308 may also be composed of a Ti/W layer. A trap generation layer (not shown) may be formed between the mirror 322 and the substrate 302.

A first conductive layer 310 may be on a surface of the oxide layer 304 that encapsulates the mirror 322. For example, the first conductive layer 310 may be aluminum (Al) and/or copper (Cu). Of course, these are exemplary only, and other conductive metals may be used. A first tungsten layer 312 (W) may be on the first conductive layer 310. A piezoelectric layer 314 (e.g., a piezoelectric material) may be on the first tungsten layer 312. For example, the piezoelectric layer 314 may be aluminum nitride (AlN). A second tungsten layer 316 may be on the piezoelectric layer 314, and a second conductive layer 318 may be on the second tungsten layer 316. Similarly, the second conductive layer 318 may be Al/Cu or any other conductive material.

A first BAW contact 350 may be coupled to the second conductive layer 318 (e.g., a first electrode) through a first via 340. A second BAW contact 352 may be coupled to the first conductive layer 310 (e.g., a second electrode) through a second via 342. The BAW filter 360 may be formed in a dielectric 330. A trimmed portion 320 may be formed by patterning and etching the dielectric 330 between the first via 340 and the second via 342. The trimmed portion 320 may be a cavity, exposing portions (e.g., sidewalls) of the first via 340 and the second via 342. The trimmed portion 320 may be used for fine tuning a frequency range of the BAW filter 360. For example, the deeper the trimmed portion 320, the higher the frequency range. Conversely, the shallower the trimmed portion 320, the lower the frequency range.

The POG device 370 may include the first conductive layer 310, the piezoelectric layer 314, and the second conductive layer 318. For example, the first conductive layer 310 may be on the substrate 302, the piezoelectric layer 314 may be on the first conductive layer 310, and the second conductive layer 318 may be on the piezoelectric layer 314. A first POG contact 354 may be coupled to the second conductive layer 318 (e.g., top electrode) through a first via 344. A second POG contact 356 may be coupled to the first conductive layer 310 (e.g., bottom electrode) through a second via 346. The POG device 370 is also be formed in the dielectric 330.

According to aspects of the present disclosure, each layer of the POG device 370 may be the same width or a different width than in the BAW filter 360. For example, the piezoelectric layer 314 may be formed thicker or thinner on the POG device 370 than on the BAW filter 360. The same may apply to the other layers as well.

According to additional aspects of the present disclosure, a thin layer of oxide may be included in the POG device 370. For example, the oxide layer 304 may be thinned down on the POG device 370 side, such that it is between the first conductive layer 310 and the substrate 302 on the right side of dotted line A-A.

Figure 4:
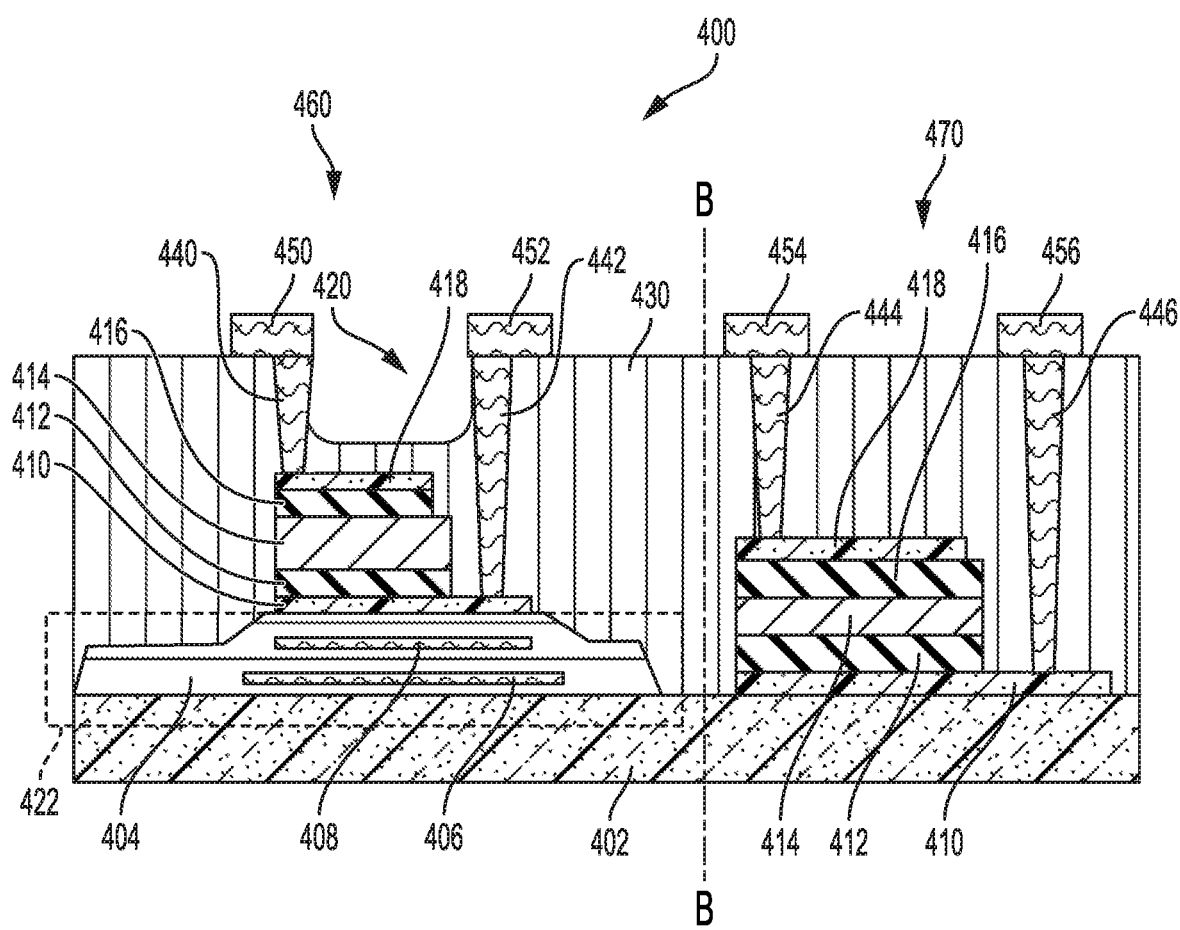
FIG. 4 illustrates a co-integrated bulk acoustic wave (BAW) filter and passive-on-glass (POG) device, according to aspects of the present disclosure.

FIG. 4 illustrates a co-integrated bulk acoustic wave (BAW) filter and passive-on-glass (POG) device, according to additional aspects of the present disclosure. According to these aspects of the present disclosure, a co-integrated filter 400 may include any passive device, such as, but not limited to, inductors, capacitors, and/or resistors. The co-integrated filter 400 may include a BAW filter 460 side-by-side with a POG device 470. The POG device 470 may be any passive device such as an inductor, capacitor, inductor-capacitor (LC) resonator, filter, or the like. For example, elements to the left of dotted line B-B may be the BAW filter 460, and elements to the right of the dotted line B-B may be the POG device 470.

The BAW filter 460 may include a mirror 422 formed on a substrate 402. In this example, the substrate is a passive substrate (e.g., a glass substrate). The mirror 422 may include a first mirror layer 406 and a second mirror layer 408 formed in an oxide layer 404. The first mirror layer 406 may be composed of a Ti/W layer, and the second mirror layer 408 may also be composed of a Ti/W layer. For example, the mirror 422 may include alternating layers of oxide and Ti/W. A trap generation layer (not shown) may be formed between the mirror 422 and the substrate 402.

A first conductive layer 410 may be on the mirror 422. For example, the first conductive layer 410 may be aluminum (Al) and/or copper (Cu). Of course, these materials are exemplary only, and other conductive metals may be used. A first tungsten layer 412 (W) may be on the first conductive layer 410. A piezoelectric layer 414 (e.g., a piezoelectric material) may be on the first tungsten layer 412. For example, the piezoelectric layer 414 may be aluminum nitride (AlN). A second tungsten layer 416 may be on the piezoelectric layer 414, and a second conductive layer 418 may be on the second tungsten layer 416. Similarly, the second conductive layer 418 may be Al/Cu or any other conductive metal.

A first BAW contact 450 may be coupled to the second conductive layer 418 (e.g., a first electrode) through a first via 440. A second BAW contact 452 may be coupled to the first conductive layer 410 (e.g., a second electrode) through a second via 442. The BAW filter 460 may be formed in a dielectric 430. A trimmed portion 420 may be formed by patterning and etching the dielectric 430 between the first via 440 and the second via 442. The trimmed portion 420 may be a cavity, exposing portions (e.g., sidewalls) of the first via 440 and the second via 442. The trimmed portion 420 may be for fine tuning a frequency range of the BAW filter 460. For example, the deeper the trimmed portion 420, the higher the frequency range, and the shallower the trimmed portion 420, the lower the frequency range.

The POG device 470 may include the first conductive layer 410, the first tungsten layer 412, the piezoelectric layer 414, the second tungsten layer 416, and the second conductive layer 418 arranged similarly as in the BAW filter 460. A first POG contact 454 may be coupled to the second conductive layer 418 (e.g., first electrode) through a first via 444. A second POG contact 456 may be coupled to the first conductive layer 410 (e.g., a second electrode) through a second via 446. The POG device 470 is also be formed in the dielectric 430.

According to aspects of the present disclosure, layers of the POG device 470 may be the same width or a different width than in the BAW filter 460. For example, the piezoelectric layer 414 may be formed thicker or thinner on the POG device 470 than on the BAW filter 460. The same may apply to the other layers as well.

According to additional aspects of the present disclosure, a thin layer of oxide may be included in the POG device 470. For example, the oxide layer 404 may be thinned down on the side of the POG device 470, such that it is between the first conductive layer 410 and the substrate 402 on the right side of dotted line B-B.

According to an alternative aspect of the present disclosure, the POG device 470 may be fabricated without the first tungsten layer 412 and the second tungsten layer 416. For example, the POG device 470 may include the first conductive layer 410 on the substrate 402, the piezoelectric layer 414 on the first conductive layer 410, and the second conductive layer 418 on the piezoelectric layer 414, similar to as shown in FIG. 3.

FIGS. 5A-5E illustrate a fabrication process for a co-integrated bulk acoustic wave (BAW) filter and passive on glass (POG) device 500, according to aspects of the present disclosure. For example, a BAW filter 560 and a POG device 570 may be fabricated side-by-side on a substrate 502. The substrate 502 may be glass.

Figure 5A:
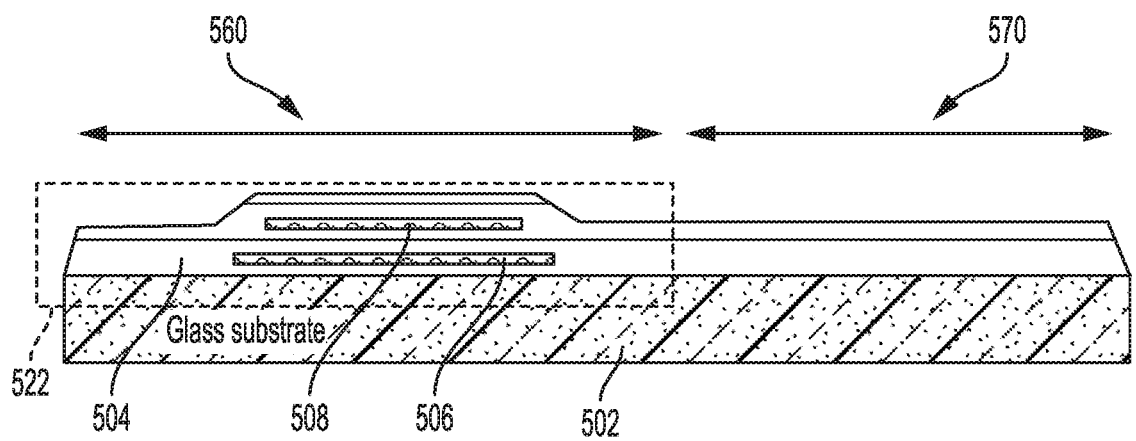
FIGS. 5A-5E illustrate a fabrication process for a co-integrated bulk acoustic wave (BAW) filter and passive-on-glass (POG) device, according to aspects of the present disclosure.

FIG. 5A illustrates fabrication of a mirror 522 by deposition of an oxide layer 504 over a first Ti/W layer 506 and a second Ti/W layer 508. For example, multiple oxide layers may be deposited over the first Ti/W layer 506 and the second Ti/W layer 508. According to aspects of the present disclosure, a trap generation layer (not shown) may be deposited on the substrate 502 prior to forming the mirror 522. As illustrated, the oxide layer 504 may extend over an entire surface of the substrate 502. The first Ti/W layer 506 and the second Ti/W layer 508 may be only on the BAW filter side of the substrate 502.

Figure 5B:
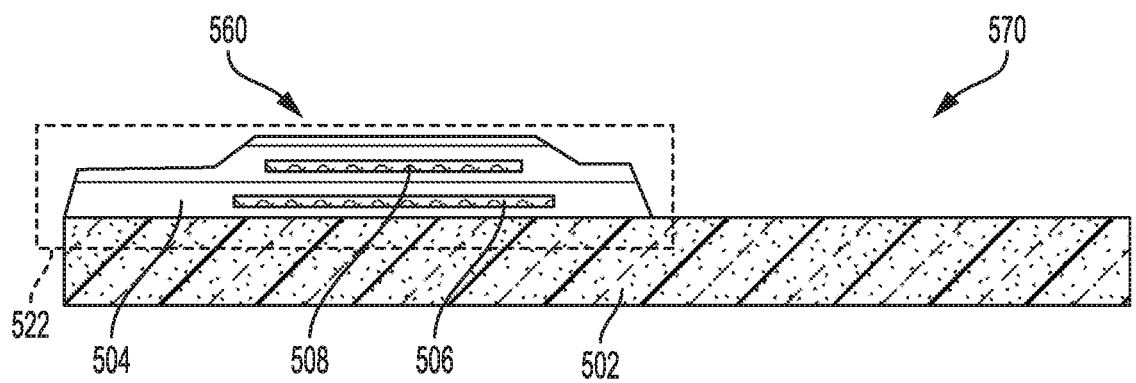
Figure 5C:
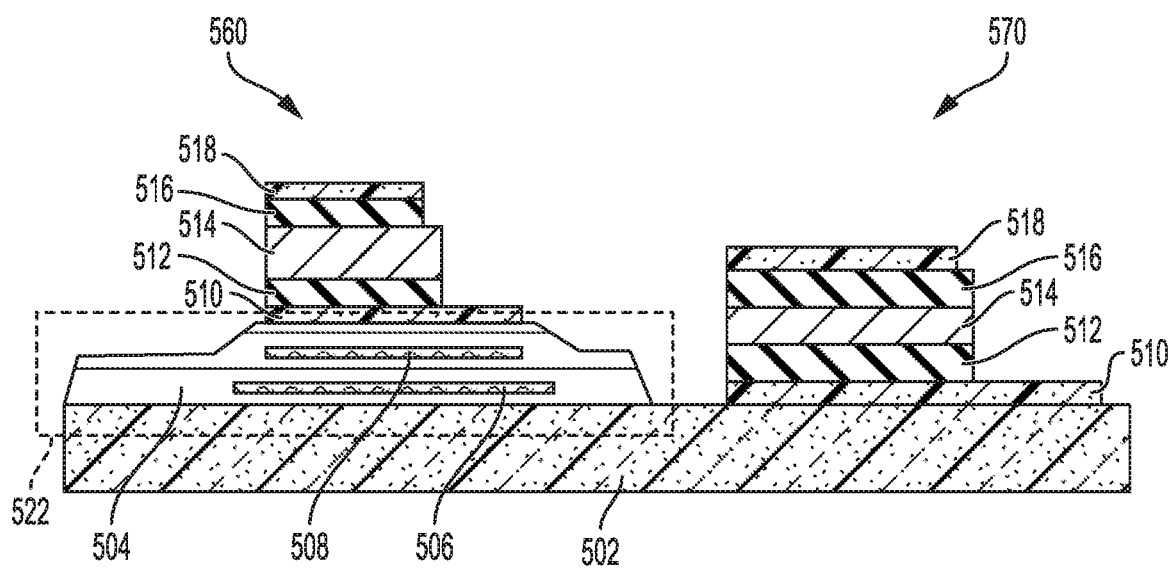

FIG. 5B illustrates etching of the POG device side of the substrate 502 to remove the oxide layer 504. FIG. 5C illustrates deposition of a first conductive layer 510 (e.g., Al/Cu or other conductive metals) on the mirror 522 for the BAW filter 560 side. On the POG device 570 side, the first conductive layer 510 is deposited on the substrate 502. A first tungsten layer 512 (W) may then be deposited over the first conductive layer 510 for both the BAW filter 560 and the POG device 570. Similarly, a piezoelectric layer 514 (e.g., AlN) may be deposited over the first tungsten layer 512, a second tungsten layer 516 may be deposited over the piezoelectric layer 514, and a second conductive layer 518 (e.g., Al/Cu or other conductive metals) may be deposited over the second tungsten layer 516.

As illustrated, a portion of the deposited layers (e.g., 510-518) between the BAW filter 560 and the POG device 570 is etched away. Additionally, portions of the mirror 522 may be exposed by etching of the deposited layers (e.g., 510-518) as well. According to alternative aspects of the present disclosure, the deposited layers (e.g., 510-518) may be continuous and not etched away.

Figure 5D:
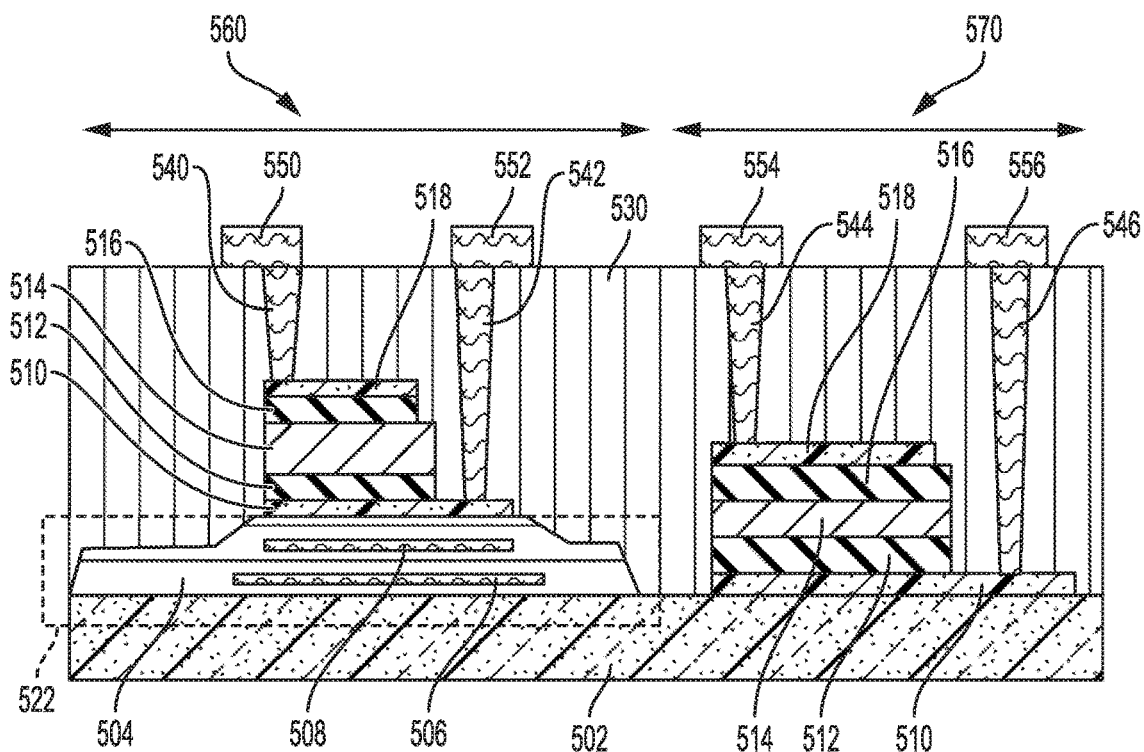

FIG. 5D illustrates a dielectric layer 530 deposited over the BAW filter 560 and the POG device 570. A first BAW contact 550 may be coupled to the second conductive layer 518 (e.g., a second electrode) through a first via 540. A second BAW contact 552 may be coupled to the first conductive layer 510 (e.g., a first electrode) through a second via 542. Similarly, a first POG contact 554 may be coupled to the second conductive layer 518 (e.g., second electrode) through a first via 544. A second POG contact 556 may be coupled to the first conductive layer 510 (e.g., first electrode) through a second via 546. According to aspects of the present disclosure, the vias (e.g., 540-546) may be formed by etching through the dielectric layer 530.

Figure 5E:
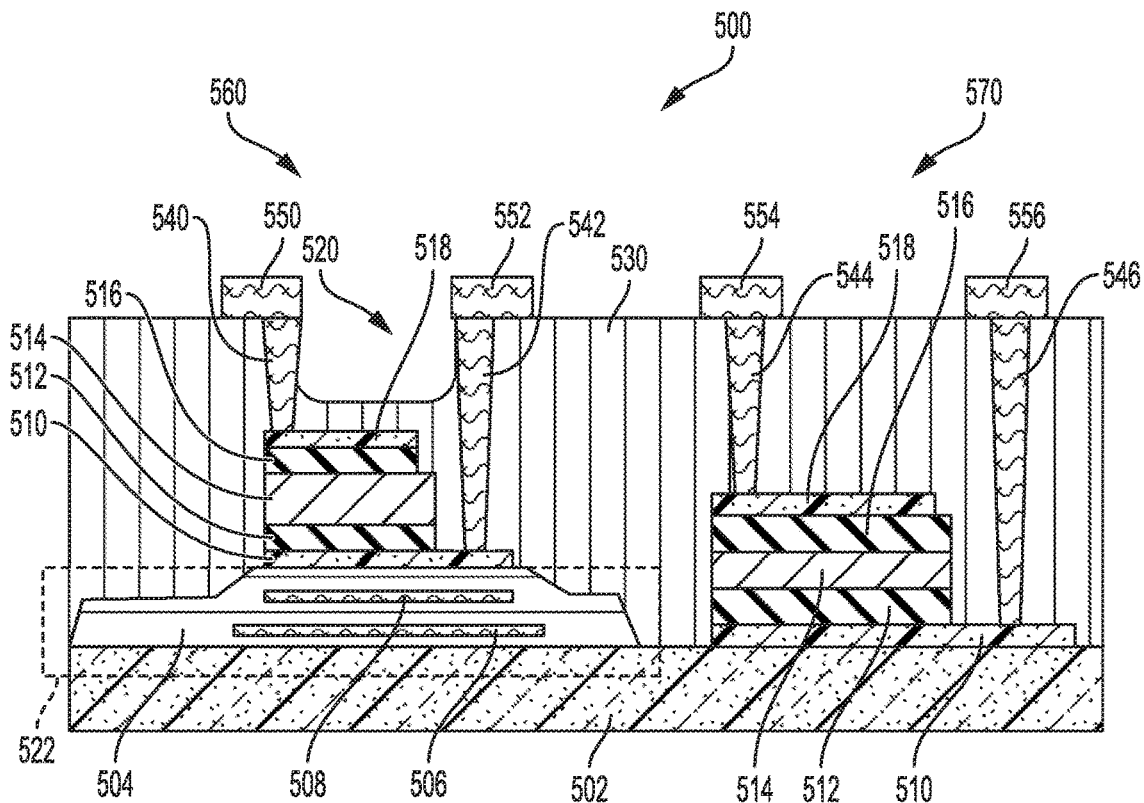

FIG. 5E illustrates etching of a portion of the dielectric layer 530 to create a trimmed portion according to aspects of the present disclosure. In this example, a trimmed portion 520 is formed by patterning and etching the dielectric layer 530 between the first via 540 and the second via 542. The trimmed portion 520 may be a cavity, exposing portions (e.g., sidewalls) of the first via 540 and the second via 542. In this example, a depth of the trimmed portion 520 may fine tune a frequency range of the BAW filter 560.

FIGS. 6A-6E illustrate a fabrication process for another co-integrated bulk acoustic wave (BAW) and passive-on-glass (POG) device 600, according to aspects of the present disclosure. For example, the BAW filter 660 and the POG device 670 may be fabricated side-by-side on a substrate 602. In this example, the substrate 602 is glass.

Figure 6A:
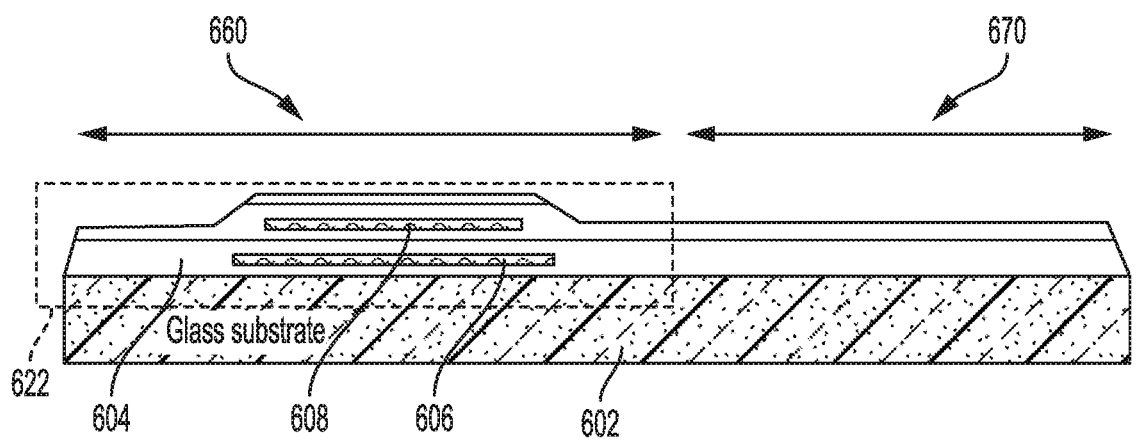
FIGS. 6A-6E illustrate a fabrication process for another co-integrated bulk acoustic wave (BAW) filter and passive-on-glass (POG) device, according to aspects of the present disclosure.
Figure 6B:
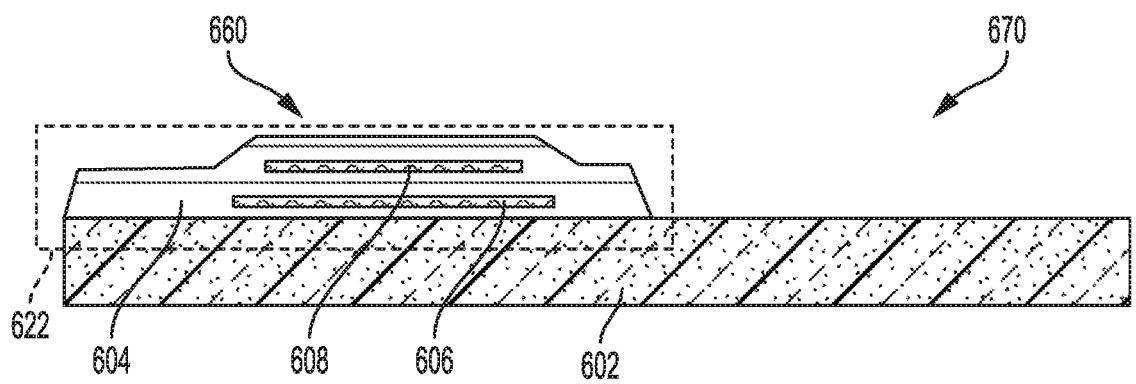

FIG. 6A illustrates fabrication of a mirror 622 by deposition of an oxide layer 604 over a first Ti/W layer 606 and a second Ti/W layer 608. For example, multiple oxide layers may be deposited over the first Ti/W layer 606 and the second Ti/W layer 608. According to aspects of the present disclosure, a trap generation layer (not shown) may be deposited on the substrate 602 prior to forming the mirror 622. As illustrated, the oxide layer 604 may extend over an entire surface of the substrate 602. The first Ti/W layer 606 and the second Ti/W layer 608 may be only on the BAW filter side of the substrate 602. FIG. 6B illustrates etching of the POG device side of the substrate 602 to remove the oxide layer 604.

Figure 6C:
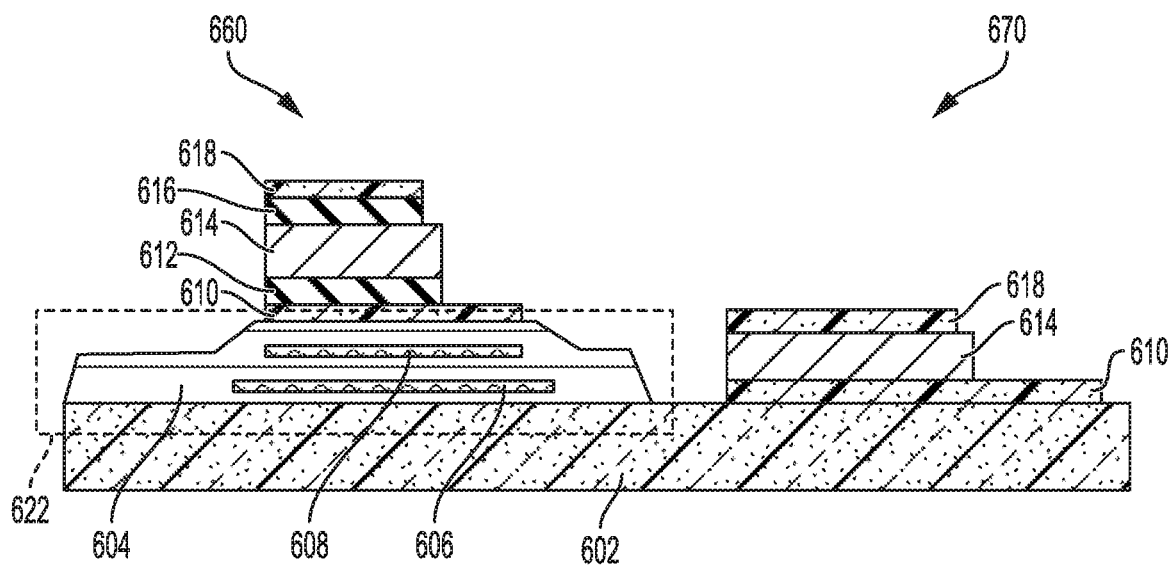

FIG. 6C illustrates deposition of a first conductive layer 610 (e.g., Al/Cu or other conductive metals) on the mirror 622 for the BAW filter side. On the POG device side, the first conductive layer 610 is deposited on the substrate 602. A first tungsten layer 612 (W) may then be deposited over the first conductive layer 610 for both the BAW filter 660 and the POG device 670. The first tungsten layer 612 may then be selectively removed from the POG device side. A piezoelectric layer 614 (e.g., AlN) may be deposited over the first tungsten layer 612 on the BAW filter side, and over the first conductive layer 610 on the POG device side. A second tungsten layer 616 may be deposited over the piezoelectric layer 614 on both the BAW filter 660 and the POG device 670. Afterwards, the second tungsten layer 616 may be selectively removed from the POG device side. A second conductive layer 618 (e.g., Al/Cu or other conductive metals) may be deposited over the second tungsten layer 616 on the BAW filter side, and over the piezoelectric layer 614 on the POG device side.

Similar to the above for FIG. 6C, a portion of the deposited layers (e.g., 610-618) between the BAW filter 660 and the POG device 670 may be etched away. Additionally, portions of the mirror 622 may be exposed by etching the deposited layers (e.g., 610-618) as well. According to alternative aspects of the present disclosure, the deposited layers (e.g., 610-618) may be continuous and not etched away.

Figure 6D:
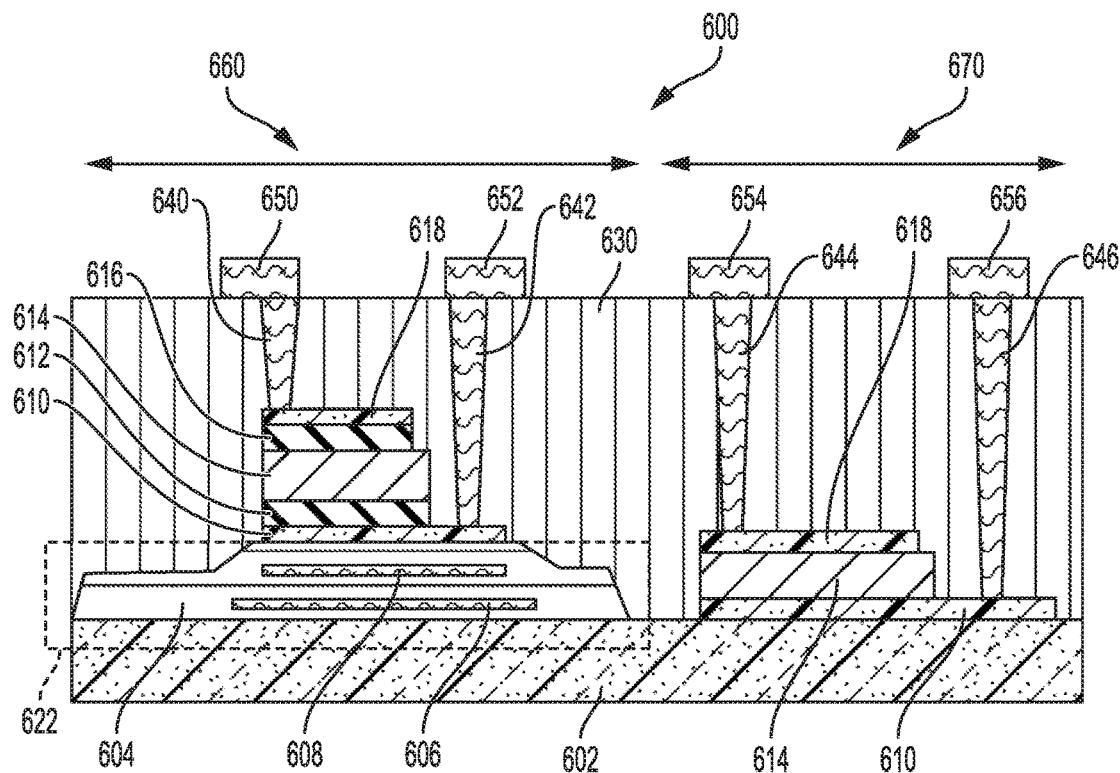

FIG. 6D illustrates a dielectric layer 630 deposited over the BAW filter 660 and the POG device 670. A first BAW contact 650 may be coupled to the second conductive layer 618 (e.g., a first electrode) through a first via 640. A second BAW contact 652 may be coupled to the first conductive layer 610 (e.g., a second electrode) through a second via 642. Similarly, a first POG contact 654 may be coupled to the second conductive layer 618 (e.g., first electrode) through a first via 644. A second POG contact 656 may be coupled to the first conductive layer 610 (e.g., a second electrode) through a second via 646. According to aspects of the present disclosure, vias (e.g., 640-646) may be formed by etching through the dielectric layer 630.

Figure 6E:
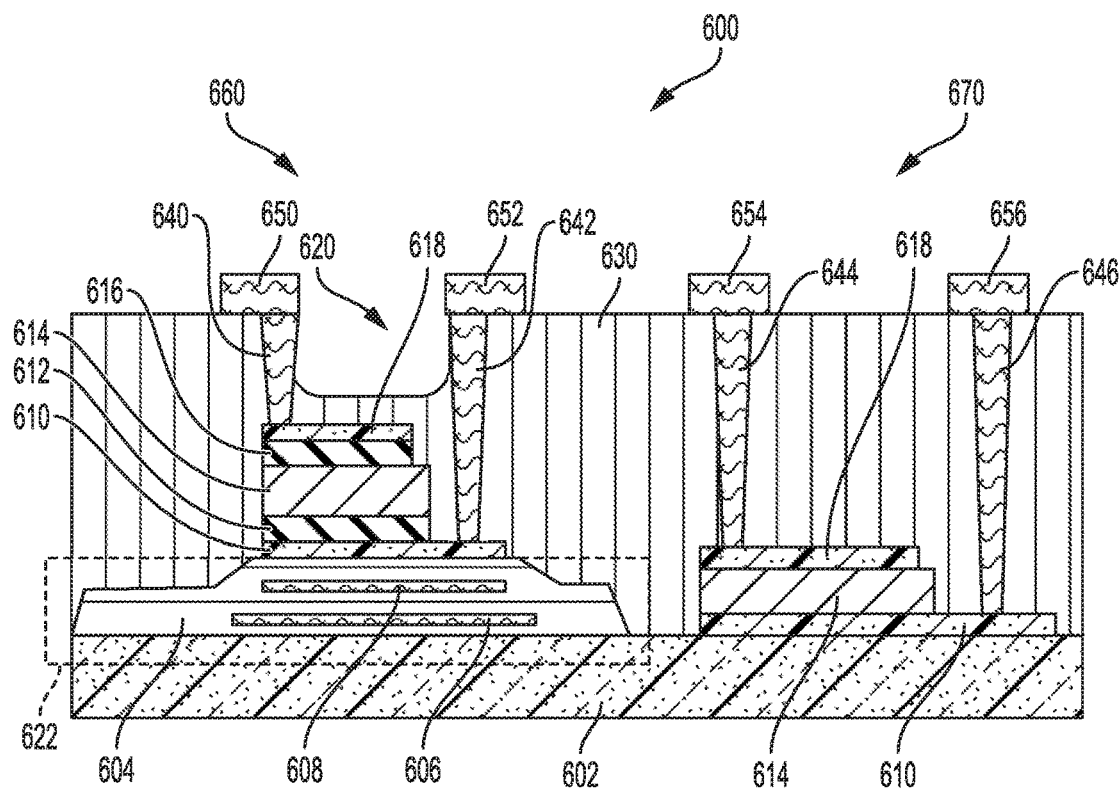

FIG. 6E illustrates etching of a portion of a dielectric layer to form a trimmed portion, according to aspects of the present disclosure. In this example, the dielectric layer 630 is patterned and etched between the first via 640 and the second via 642 to form a trimmed portion 620. A depth of the trimmed portion 620 may fine tune a frequency range of the BAW filter 660.

Figure 7:
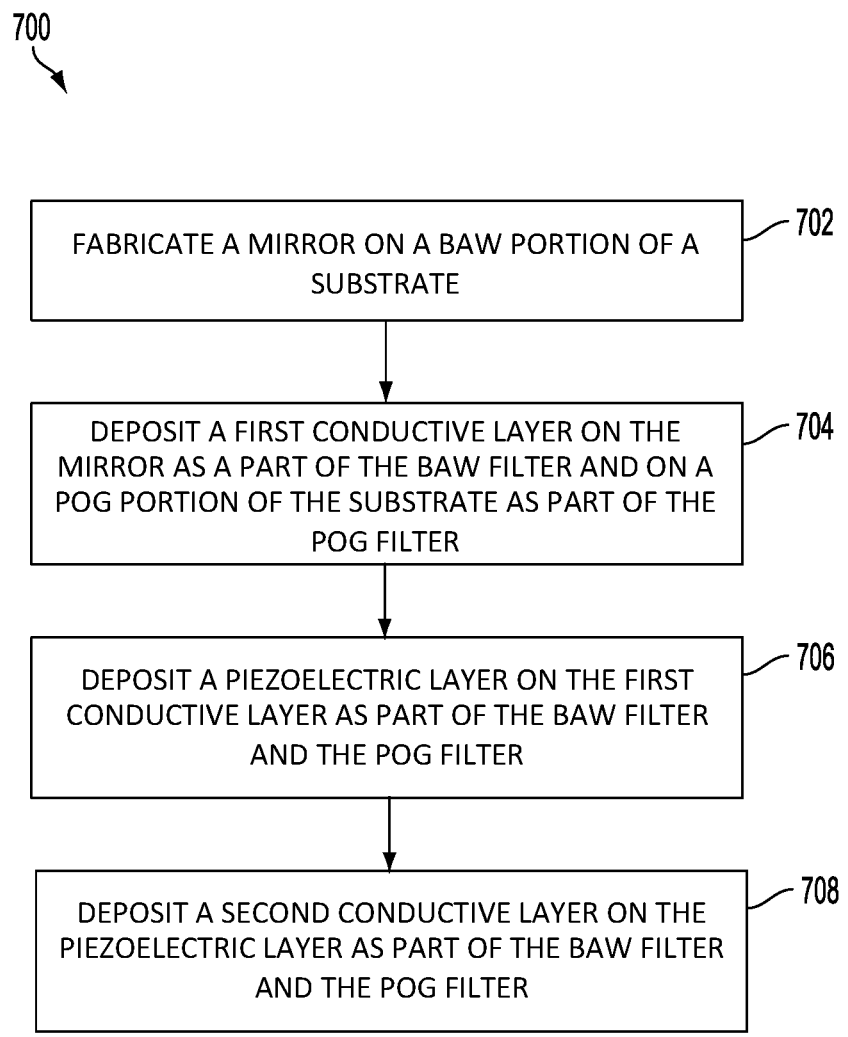
FIG. 7 is a process flow diagram illustrating a method of fabricating an electronic device, according to aspects of the present disclosure.

FIG. 7 is a process flow diagram 700 illustrating a method of fabricating an electronic device, according to aspects of the present disclosure. In block 702, a mirror is fabricated on a BAW portion of a substrate. For example, as illustrated in FIG. 5A, the mirror 522 is fabricated on the BAW filter portion of the substrate 502.

In block 704, a first conductive layer is deposited on the mirror as a part of the BAW filter and on a POG portion of the substrate as part of the POG device. For example, as illustrated in FIG. 5C, the first conductive layer 510 is deposited on both the BAW filter portion of the substrate 502 and the POG device portion of the substrate 502.

In block 706, a piezoelectric layer is deposited on the first conductive layer as part of the BAW filter and the POG device. For example, as illustrated in FIG. 5C, the piezoelectric layer 514 may be deposited on both the BAW filter portion of the substrate 502 and the POG device portion of the substrate 502.

In block 708, a second conductive layer is deposited on the piezoelectric layer as part of the BAW filter and the POG device. For example, as illustrated in FIG. 5C, the second conductive layer 518 may be deposited on both the BAW filter portion of the substrate 502 and the POG device portion of the substrate 502.

According to further aspects of the present disclosure, the method may further include depositing a first tungsten (W) layer on the first conductive layer and depositing a second tungsten layer on the piezoelectric layer. For example, depositing the first and second tungsten layers may be part of the BAW filter or both the BAW filter and the POG device. According to additional aspects of the present disclosure, the method may further include depositing a dielectric over the mirror, the first conductive layer, the piezoelectric layer, and the second conductive layer as part of the BAW filter and the POG device. The method may also include trimming the dielectric as part of the BAW filter.

According to additional aspects of the present disclosure, the method may include coupling a first BAW contact to the second conductive layer as part of the BAW filter, and coupling a second BAW contact to the first conductive layer as part of the BAW filter. The method may further include coupling a first POG contact to the second conductive layer as part of the POG device, and coupling a second POG contact to the first conductive layer as part of the POG device. The BAW portion and the POG portion may be side-by-side.

According to an aspect of the present disclosure, an electronic device is described. In one configuration, the electronic device includes means for filtering. For example, the filtering means may be the bulk acoustic wave (BAW) filter 360, 460 and/or the POG device 370, 470 of FIGS. 3 and 4. In another aspect, the aforementioned means may be any module or any apparatus or material configured to perform the functions recited by the aforementioned means.

Figure 8:
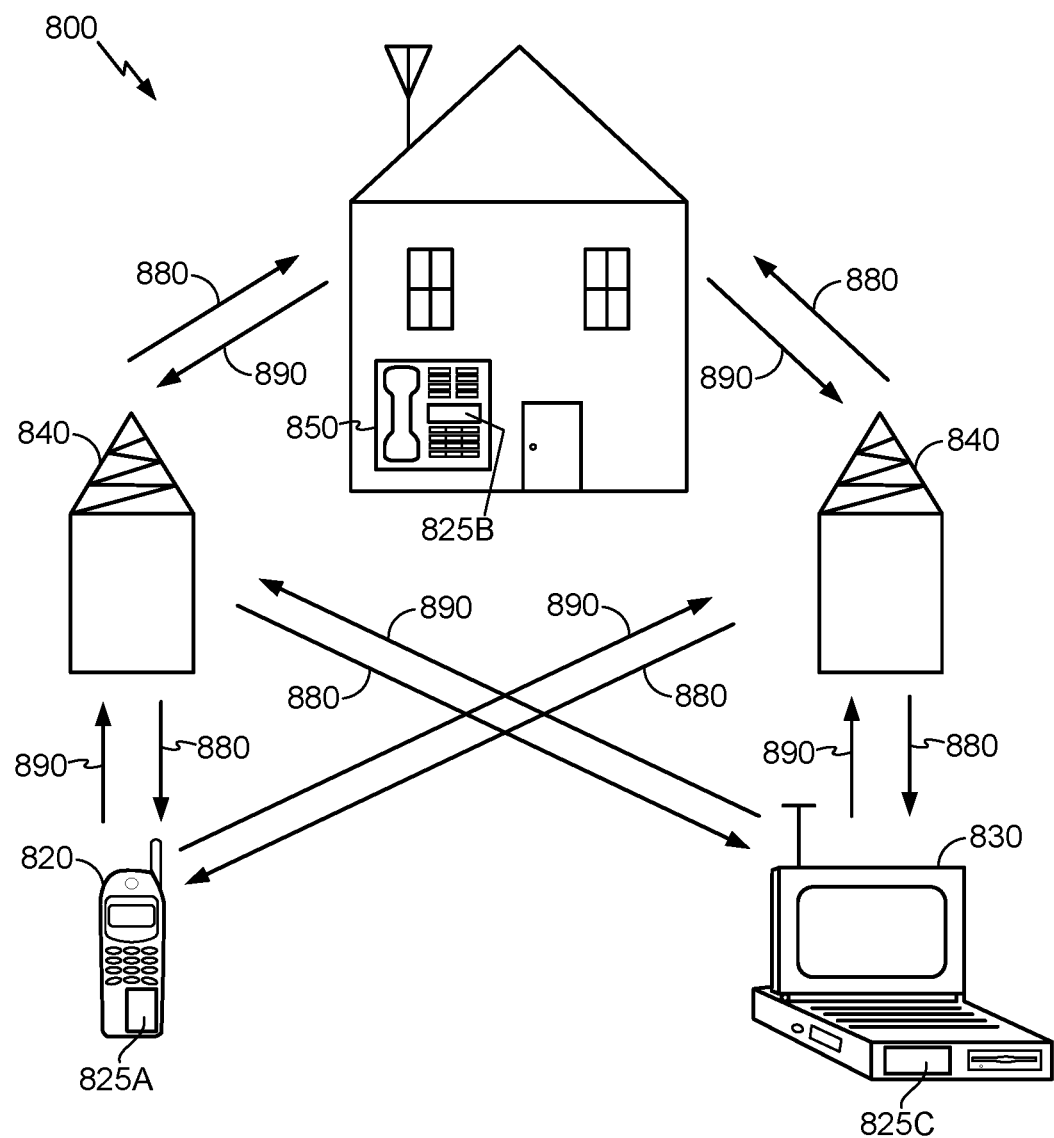
FIG. 8 is a block diagram showing an exemplary wireless communications system in which a configuration of the disclosure may be advantageously employed.

FIG. 8 is a block diagram showing an exemplary wireless communications system 800 in which an aspect of the present disclosure may be advantageously employed. For purposes of illustration, FIG. 8 shows three remote units 820, 830, and 850 and two base stations 840. It will be recognized that wireless communications systems may have many more remote units and base stations. Remote units 820, 830, and 850 include IC devices 825A, 825C, and 825B that include the disclosed electronic device. It will be recognized that other devices may also include the disclosed electronic device, such as the base stations, switching devices, and network equipment. FIG. 8 shows forward link signals 880 from the base station 840 to the remote units 820, 830, and 850 and reverse link signals 890 from the remote units 820, 830, and 850 to base stations 840.

In FIG. 8, remote unit 820 is shown as a mobile telephone, remote unit 830 is shown as a portable computer, and remote unit 850 is shown as a fixed location remote unit in a wireless local loop system. For example, a remote units may be a mobile phone, a hand-held personal communications systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 8 illustrates remote units according to the aspects of the present disclosure, the disclosure is not limited to these exemplary illustrated units. Aspects of the present disclosure may be suitably employed in many devices, which include the disclosed electronic device.

Figure 9:
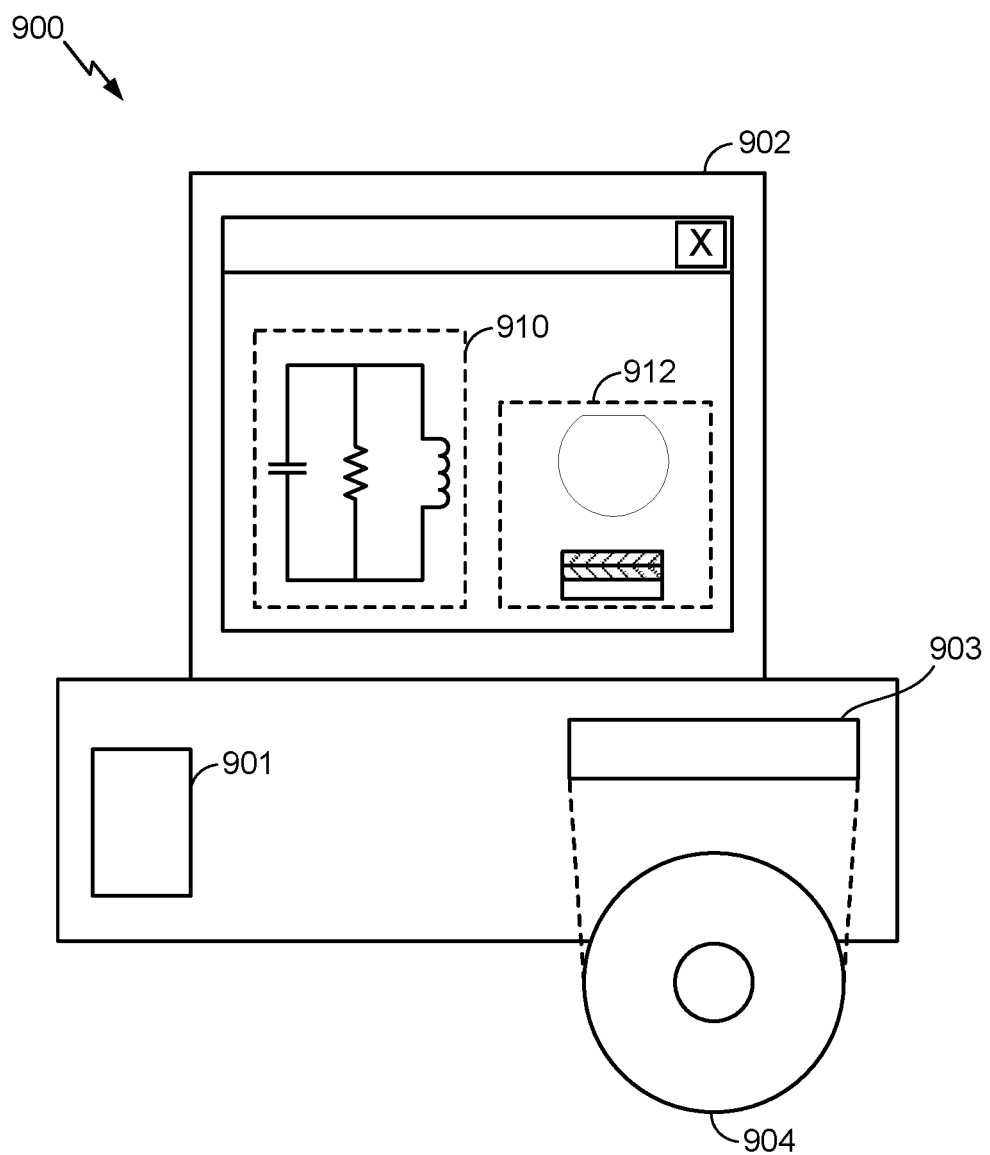
FIG. 9 is a block diagram illustrating a design workstation used for circuit, layout, and logic design of an electronic device, according to one configuration.

FIG. 9 is a block diagram illustrating a design workstation used for circuit, layout, and logic design of a filter component, such as the electronic device disclosed above. A design workstation 900 includes a hard disk 901 containing operating system software, support files, and design software such as Cadence or OrCAD. The design workstation 900 also includes a display 902 to facilitate a circuit design 910 or a filter component design 912 such as the electronic device. A storage medium 904 is provided for tangibly storing the circuit design 910 or a filter component design 912. The circuit design 910 or the filter component design 912 may be stored on the storage medium 904 in a file format such as GDSII or GERBER. The storage medium 904 may be a CD-ROM, DVD, hard disk, flash memory, or other appropriate device. Furthermore, the design workstation 900 includes a drive apparatus 903 for accepting input from or writing output to the storage medium 904.

Data recorded on the storage medium 904 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 904 facilitates the circuit design 910 or the filter component design 912 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to any type of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communications apparatus. For example, a communications apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the present disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. An electronic device, comprising:
   a passive substrate;
   a passive-on-glass (POG) device on the passive substrate;
   a bulk acoustic wave (BAW) filter on the passive substrate, in which the POG device and the BAW filter are side-by-side on the passive substrate; and
   a dielectric layer on the POG device, the BAW filter, and a surface of the passive substrate between the POG device and the BAW filter.

2. The electronic device of claim 1, in which the POG device comprises a piezoelectric material.

3. The electronic device of claim 2, in which the piezoelectric material comprises aluminum nitride (AlN).

4. The electronic device of claim 1, in which the POG device comprises tungsten (W) and the BAW filter comprises tungsten.

5. The electronic device of claim 1, in which the BAW filter comprises a mirror on the passive substrate.

6. The electronic device of claim 5, in which the mirror comprises alternating layers of oxide and titanium (Ti)/tungsten (W).

7. The electronic device of claim 1, in which the passive substrate comprises a glass substrate.

8. The electronic device of claim 1, integrated into a radio frequency (RF) front end module, the RF front end module incorporated into at least one of a music player, a video player, an entertainment unit, a navigation device, a communications device, a personal digital assistant (PDA), a fixed location data unit, a mobile phone, and a portable computer.

9. A method of fabricating an electronic device including a passive-on-glass (POG) device and a bulk acoustic wave (BAW) filter, comprising:
   fabricating a mirror on a BAW portion of a substrate;
   depositing a first conductive layer on the mirror as part of the BAW filter and on a POG portion of the substrate as part of the POG device;
   depositing a piezoelectric layer on the first conductive layer as part of the BAW filter and the POG device;
   depositing a second conductive layer on the piezoelectric layer as part of the BAW filter and the POG device, in which the BAW filter and the POG device are side-by-side on the passive substrate; and
   depositing a dielectric on the BAW filter, the POG device, and an exposed surface of the passive substrate between the BAW filter and the POG device.

10. The method of claim 9, further comprising:
    depositing a first tungsten (W) layer on the first conductive layer as part of the BAW filter; and
    depositing a second tungsten layer on the piezoelectric layer as part of the BAW filter.

11. The method of claim 9, further comprising:
    depositing a first tungsten (W) layer on the first conductive layer as part of the BAW filter and the POG device; and
    depositing a second tungsten layer on the piezoelectric layer as part of the BAW filter and the POG device.

12. The method of claim 9, in which depositing the dielectric comprises:
    depositing a dielectric material over the mirror, the first conductive layer, the piezoelectric layer, and the second conductive layer as part of the BAW filter and the POG device; and
    trimming the dielectric material as part of the BAW filter.

13. The method of claim 9, further comprising:
    coupling a first BAW contact to the second conductive layer as part of the BAW filter; and
    coupling a second BAW contact to the first conductive layer as part of the BAW filter.

14. The method of claim 9, further comprising:
    coupling a first POG contact to the second conductive layer as part of the POG device; and coupling a second POG contact to the first conductive layer as part of the POG device.

15. The method of claim 9, further comprising integrating the electronic device into a radio frequency (RF) front end module, the RF front end module incorporated into at least one of a music player, a video player, an entertainment unit, a navigation device, a communications device, a personal digital assistant (PDA), a fixed location data unit, a mobile phone, and a portable computer.

16. A radio frequency (RF) front end module, comprising:
    an electronic device, comprising a passive substrate, a passive-on-glass (POG) device on the passive substrate, a bulk acoustic wave (BAW) filter on the passive substrate, in which the POG device and the BAW filter are side-by-side on the passive substrate;
    a dielectric layer on the POG device, the BAW filter, and a surface of the passive substrate between the POG device and the BAW filter; and
    an antenna coupled to the electronic device.

17. The RF front end module of claim 16, in which the POG device comprises a piezoelectric material and the passive substrate comprises a glass substrate.

18. The RF front end module of claim 16, incorporated into at least one of a music player, a video player, an entertainment unit, a navigation device, a communications device, a personal digital assistant (PDA), a fixed location data unit, a mobile phone, and a portable computer.

* * * * *